(12) United States Patent
Tanaka et al.

(10) Patent No.: US 11,325,220 B2
(45) Date of Patent: May 10, 2022

(54) DOUBLE-SIDE POLISHING METHOD AND DOUBLE-SIDE POLISHING APPARATUS

(71) Applicant: SHIN-ETSU HANDOTAI CO., LTD., Tokyo (JP)

(72) Inventors: Yuki Tanaka, Nishigo-mura (JP); Shiro Amagai, Nishigo-mura (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 751 days.

(21) Appl. No.: 16/061,841

(22) PCT Filed: Feb. 1, 2017

(86) PCT No.: PCT/JP2017/003568
§ 371 (c)(1),
(2) Date: Jun. 13, 2018

(87) PCT Pub. No.: WO2017/141704
PCT Pub. Date: Aug. 24, 2017

(65) Prior Publication Data
US 2018/0361530 A1    Dec. 20, 2018

(30) Foreign Application Priority Data
Feb. 16, 2016  (JP) .............................. JP2016-027136

(51) Int. Cl.
*B24B 37/08*  (2012.01)
*B24B 37/04*  (2012.01)
(Continued)

(52) U.S. Cl.
CPC ............ *B24B 37/08* (2013.01); *B24B 37/042* (2013.01); *B24B 37/24* (2013.01); *B24B 37/28* (2013.01);
(Continued)

(58) Field of Classification Search
CPC ....... B24B 37/08; B24B 37/042; B24B 37/24; B24B 37/28; H01L 21/02024; H01L 21/67092
(Continued)

(56) References Cited

U.S. PATENT DOCUMENTS

| | | | |
|---|---|---|---|
| 2003/0104698 A1* | 6/2003 | Taniguchi | B24B 37/24 438/692 |
| 2014/0206261 A1* | 7/2014 | Roettger | H01L 21/304 451/41 |
| 2014/0235143 A1* | 8/2014 | Staudhammer | B24B 53/017 451/56 |

FOREIGN PATENT DOCUMENTS

| | | |
|---|---|---|
| JP | 2014-110433 A | 6/2014 |
| JP | 2014-223704 A | 12/2014 |
| JP | 2016-022542 A | 2/2016 |

OTHER PUBLICATIONS

Mar. 21, 2017 Search Report issued in International Patent Application No. PCT/JP2017/003568.

* cited by examiner

*Primary Examiner* — Joseph J Hail
*Assistant Examiner* — J Stephen Taylor
(74) *Attorney, Agent, or Firm* — Oliff PLC

(57) ABSTRACT

A double-side polishing method, including: simultaneously polishing both surfaces of a semiconductor wafer by holding the semiconductor wafer in a carrier, interposing the held semiconductor wafer between an upper turn table and a lower turn table each having a polishing pad attached thereto, and bringing both surfaces of the semiconductor wafer into sliding contact with the polishing pads, wherein the semiconductor wafer is polished under a condition that a thickness A (mm) of the polishing pad attached to the upper turn table and a thickness B (mm) of the polishing pad
(Continued)

attached to the lower turn table satisfy relations of $1.0 \leq A+B \leq 2.0$ and $A/B > 1.0$. This provides a double-side polishing method capable of obtaining a semiconductor wafer in which F-ZDD<0 while controlling the GBIR value to be equal to or smaller than a required value.

18 Claims, 1 Drawing Sheet

(51) Int. Cl.
 *B24B 37/24* (2012.01)
 *B24B 37/28* (2012.01)
 *H01L 21/00* (2006.01)
 *H01L 21/02* (2006.01)
 *H01L 21/67* (2006.01)
(52) U.S. Cl.
 CPC .. *H01L 21/02024* (2013.01); *H01L 21/67092* (2013.01)
(58) Field of Classification Search
 USPC .......................................................... 451/41
 See application file for complete search history.

DOUBLE-SIDE POLISHING METHOD AND DOUBLE-SIDE POLISHING APPARATUS

TECHNICAL FIELD

The present invention relates to a double-side polishing method and a double-side polishing apparatus.

BACKGROUND ART

In flatness required for semiconductor wafers such as silicon wafers, requirements for an F-ZDD (Front Z-Height Double Differentiation), which is an evaluation indicator of a shape at the periphery of a semiconductor wafer, have been increasing recently. Specifically, semiconductor wafers in which F-ZDD<0 are required, that is, the shapes of semiconductor wafers are required to have sag geometry at the periphery.

In a production process of a semiconductor wafer, the semiconductor wafer is typically subjected to double-side polishing. In double-side polishing, a semiconductor wafer is interposed between polishing pads that are individually attached to the upper and lower turn tables, and the semiconductor wafer is subjected to sliding motion to polish the both surfaces of the front surface and the back surface simultaneously (see Patent Literature 1, for example). The double-side polishing is conventionally performed by using upper and lower turn tables to which polishing pads of the same kind with the same thickness are attached. In this case, the F-ZDD can be less than 0 by increasing the thickness of the polishing pads.

CITATION LIST

Patent Literature

Patent LITERATURE 1: Japanese Unexamined Patent Application Publication (Kokai) No. 2014-223704

SUMMARY OF INVENTION

Problem to be Solved by the Invention

On the other hand, there is also demand for controlling GBIR (Global BackSurface-Referenced Ideal Plane/Range), which is one of evaluation indicators of flatness of a semiconductor wafer, to a small value as before. That is, GBIR is required to be equal to or smaller than a value required by customers likewise.

In double-side polishing, however, when the thicknesses of polishing pads are increased in order to control an F-ZDD to less than 0 as described above, a semiconductor wafer cause to have a convex shape to increase the GBIR, and the GBIR becomes larger than a required value. That is, a trade-off relation exists between the GBIR and the F-ZDD, and it has been difficult to satisfy the both requirements.

The present invention was accomplished in view of the above-described problems. It is an object of the present invention to provide a double-side polishing method and a double-side polishing apparatus capable of obtaining a semiconductor wafer in which F-ZDD<0 while controlling the GBIR value to be equal to or smaller than a required value.

Means for Solving Problem

To achieve the above object, the present invention provides a double-side polishing method, including: simultaneously polishing both surfaces of a semiconductor wafer by holding the semiconductor wafer in a carrier, interposing the held semiconductor wafer between an upper turn table and a lower turn table each having a polishing pad attached thereto, and bringing both surfaces of the semiconductor wafer into sliding contact with the polishing pads, wherein the semiconductor wafer is polished under a condition that a thickness A (mm) of the polishing pad attached to the upper turn table and a thickness B (mm) of the polishing pad attached to the lower turn table satisfy relations of $1.0 \leq A+B \leq 2.0$ and $A/B > 1.0$.

The present invention enables a semiconductor wafer after the double-side polishing to have a GBIR kept sufficiently small by controlling the sum (A+B) of the thicknesses of polishing pads attached to upper and lower turn tables, and enables a semiconductor wafer after the double-side polishing to have an F-ZDD controlled to an optional negative value by optimizing the ratio (A/B) of the thicknesses of polishing pads on the upper and lower turn tables. That is, the present invention makes it possible to control the F-ZDD of a semiconductor wafer after the double-side polishing to an optional and appropriate negative value, which is less than 0, while keeping the GBIR sufficiently small.

In the inventive double-side polishing method, it is preferable that the semiconductor wafer is polished under a condition that the thickness A (mm) of the polishing pad attached to the upper turn table and the thickness B (mm) of the polishing pad attached to the lower turn table further satisfy a relation of $1.5 \leq A/B \leq 2.5$.

When $1.5 \leq A/B$ as described above, it becomes more certain to control the F-ZDD of a semiconductor wafer after the double-side polishing to a negative value. When $A/B \leq 2.5$, the polishing pad attached to a lower turn table is secured to have a more sufficient thickness, and is securely prevented from tearing caused during double-side polishing.

It is preferable that the polishing pad attached to each of the upper turn table and the lower turn table has a Shore A hardness of 85 or more and 95 or less.

When the polishing pads attached to the upper turn table and the lower turn table each have a Shore A hardness of 85 or more, it is possible to control the GBIR and F-ZDD more accurately. When the polishing pads each have a Shore A hardness of 95 or less, a semiconductor wafer is hard to cause a scratch.

It is preferable that the thickness B of the polishing pad attached to the lower turn table is 0.3 mm or more.

The polishing pad attached to the lower turn table having a thickness B of 0.3 mm or more is preferable since the polishing pad is prevented from causing a problem of the strength.

To achieve the above object, the present invention also provides a double-side polishing apparatus, including: an upper turn table and a lower turn table each having a polishing pad attached thereto, and a carrier having a holding hole formed therein to hold a semiconductor wafer between the upper turn table and the lower turn table, wherein a thickness A (mm) of the polishing pad attached to the upper turn table and a thickness B (mm) of the polishing pad attached to the lower turn table satisfy relations of $1.0 \leq A+B \leq 2.0$ and $A/B > 1.0$.

The double-side polishing apparatus as described above enables a semiconductor wafer after the double-side polishing to have a GBIR kept sufficiently small since the sum (A+B) of the thicknesses of polishing pads attached to the upper and lower turn tables is optimized, and also enables the semiconductor wafer after the double-side polishing to have an F-ZDD controlled to an appropriate negative value since the ratio (A/B) of the thicknesses of polishing pads attached to the upper and lower turn tables is also optimized.

The inventive double-side polishing apparatus is preferably an apparatus in which the thickness A (mm) of the polishing pad attached to the upper turn table and the thickness B (mm) of the polishing pad attached to the lower turn table further satisfy a relation of 1.5≤A/B≤2.5.

The inventive double-side polishing apparatus, with the upper and lower polishing pads satisfying 1.5≤A/B, makes it possible to control the F-ZDD of a semiconductor wafer after the double-side polishing to a value less than 0 with certainty. The polishing pad attached to a lower turn table is secured to have a sufficient thickness since A/B≤2.5, and is securely prevented from tearing caused during double-side polishing.

It is preferable that the polishing pad attached to each of the upper turn table and the lower turn table has a Shore A hardness of 85 or more and 95 or less.

The inventive double-side polishing apparatus makes it possible to control the GBIR and F-ZDD more accurately when the polishing pads attached to an upper turn table and a lower turn table each have a Shore A hardness of 85 or more. When the polishing pads each have a Shore A hardness of 95 or less, a semiconductor wafer is hard to cause a scratch.

It is preferable that the thickness B of the polishing pad attached to the lower turn table is 0.3 mm or more.

The polishing pad attached to the lower turn table having a thickness B of 0.3 mm or more is preferable since the polishing pad is prevented from causing a problem of the strength.

Effect of Invention

The inventive double-side polishing method and double-side polishing apparatus allow double-side polishing to give a semiconductor wafer in which F-ZDD<0 while controlling the GBIR value to be equal to or smaller than a required value.

DESCRIPTION OF EMBODIMENTS

Regarding the present invention, the embodiments will be described in the following, but the present invention is not limited thereto.

As described above, polishing pads have to be thicken in the previous arts to control a semiconductor wafer after double-side polishing to have an F-ZDD of less than 0. When the polishing pads are thickened, however, a semiconductor wafer subjected to double-side polishing cause to increase the GBIR. Accordingly, it has been difficult to control the F-ZDD to less than 0 while controlling the GBIR equal to or less than a value required by customers.

The present inventors have diligently studied to solve such a problem. The present inventors have consequently found that the GBIR and the F-ZDD can be respectively controlled by the sum (A+B) and the ratio (A/B) of the thickness A (mm) of a polishing pad attached to the upper turn table and the thickness B (mm) of a polishing pad attached to the lower turn table; thereby optimizing these sum and ratio to complete the present invention.

Figure 1:
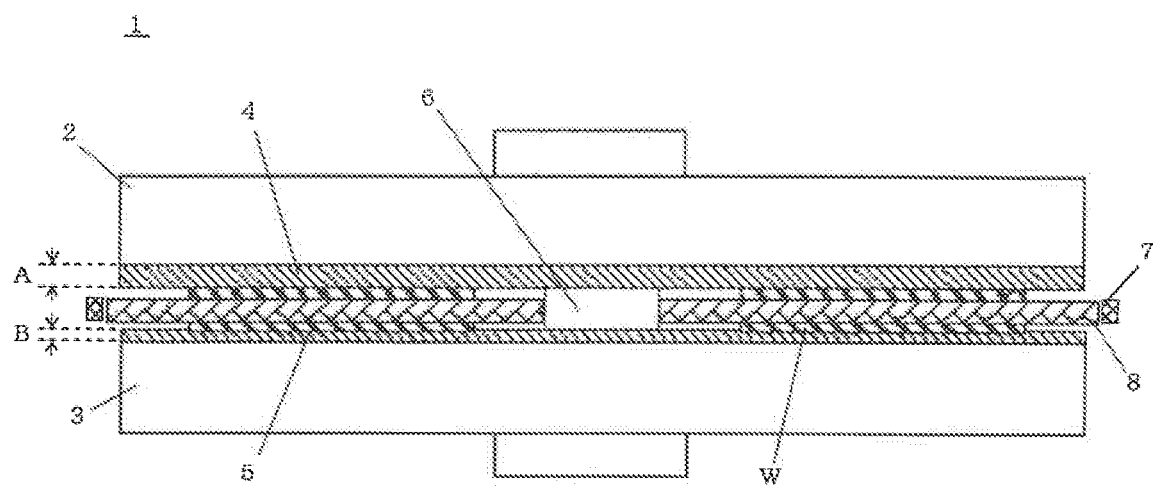
FIG. 1 is a schematic diagram to illustrate an example of double-side polishing apparatus of the present invention.

First, the inventive double-side polishing apparatus is described by referring to FIG. 1. As shown in FIG. 1, the inventive double-side polishing apparatus 1 has an upper turn table 2 and a lower turn table 3 that are disposed so as to face one another in the vertical direction. An upper polishing pad 4 and a lower polishing pad 5 are attached to the upper turn table 2 and the lower turn table 3 respectively. Between the upper turn table 2 and the lower turn table 3, a carrier 8 is disposed having a holding hole formed therein to hold a semiconductor wafer W. When the semiconductor wafer W is double-polished, the semiconductor wafer W is held in the holding hole of the carrier 8, and is interposed between the upper turn table 2 and the lower turn table 3. At the center between the upper turn table 2 and the lower turn table 3 is provided a sun gear 6; at a circumferential portion therebetween is provided an internal gear 7.

Some teeth of the sun gear 6 and the internal gear 7 engage with corresponding outer circumferential teeth of the carrier 8. The sun gear 6 and the internal gear 7 are driven to rotate with the upper turn table 2 and the lower turn table 3. This makes the carrier 8 revolve the sun gear 6 while rotating. The inventive double-side polishing apparatus 1 can be a 4-way type double-side polishing apparatus like this in which each of the upper turn table 2, the lower turn table 3, the sun gear 6, and the internal gear 7 are driven. In this case, the semiconductor wafer W is held in the holding hole of the carrier 8, and the both surfaces thereof are polished simultaneously with the upper polishing pad 4 and the lower polishing pad 5. In the double-side polishing, a polishing agent is supplied.

In the inventive double-side polishing apparatus 1, the thickness A (mm) of the upper polishing pad 4 attached to the upper turn table 2 and the thickness B (mm) of the lower polishing pad 5 attached to the lower turn table 3 satisfy relations of 1.0≤A+B≤2.0 and A/B>1.0. The inventive double-side polishing apparatus 1, using polishing pads in which thickness of the upper polishing pad and thickness of the lower polishing pad are different from each other, is capable of controlling the GBIR and the F-ZDD by the value of A+B and the value of A/B respectively. When the value of A+B and the value of A/B are each in the range described above, it is possible to control the F-ZDD to an optional and appropriate negative value while controlling the GBIR sufficiently small.

When A+B>2.0, the GBIR increases excessively. On the other hand, when A+B<1.0, the value of B becomes too small, that is, the lower polishing pad 5 becomes too thin, and therefore tearing of the lower polishing pad 5 is caused during double-side polishing. When A/B≤1.0, it becomes impossible to realize F-ZDD<0.

In the inventive double-side polishing apparatus 1, the thickness A (mm) of the upper polishing pad 4 attached to the upper turn table 2 and the thickness B (mm) of the lower polishing pad 5 attached to the lower turn table 3 preferably satisfy the relation of 1.5≤A/B≤2.5. When 1.5≤A/B, it becomes more certain to realize F-ZDD<0. When A/B≤2.5, the lower polishing pad 5 is secured to have a more sufficient thickness, thereby being securely prevented from tearing caused during double-side polishing. Preferably, the thickness B of the lower polishing pad 5 attached to the lower turn table is 0.3 mm or more, that is, B≥0.3. The lower polishing pad 5 having a thickness B of 0.3 mm or more is preferable since the polishing pad is prevented from causing a problem of the strength.

Each of the upper and lower polishing pads 4 and 5, which are attached to the upper and lower turn tables 2 and 3 respectively, preferably have a Shore A hardness of 85 or more and 95 or less. When the Shore A hardness of each of the polishing pads 4 and 5 is 85 or more, the GBIR and F-ZDD can be controlled more accurately. When the Shore A hardness of each of the polishing pads 4 and 5 is 95 or less, the semiconductor wafer W is hard to cause a scratch. As the polishing pads 4 and 5, foamed polyurethane pad can be used, for example.

The carrier 8 to hold the semiconductor wafer W can be made from material such as metal or metal having arbitrary coating. The holding hole of the carrier 8 can be provided with a resin insert at the internal circumference.

The polishing agent supplied during double-side polishing can be an aqueous inorganic alkaline solution containing colloidal silica, for example.

Subsequently, the inventive double-side polishing method by using the double-side polishing apparatus 1 as described above will be described.

In the double-side polishing method of the present invention, the both surfaces of a semiconductor wafer W are simultaneously polished by interposing the semiconductor wafer W held in the carrier 8 between the upper turn table 2 and the lower turn table 3 respectively having polishing pads 4 and 5 attached thereto, and bringing both surfaces of the semiconductor wafer W into sliding contact with the polishing pads 4 and 5. In this case, the polishing is performed under a condition that the thickness A (mm) of the upper polishing pad 4 and the thickness B (mm) of the lower polishing pad 5 satisfy relations of $1.0 \leq A+B \leq 2.0$ and $A/B > 1.0$.

The F-ZDD can be controlled to an optional and appropriate negative value while controlling the GBIR small by using polishing pads in which thickness of the upper polishing pad and thickness of the lower polishing pad are different from each other as described above, controlling the GBIR and the F-ZDD by the value of A+B and the value of A/B respectively, and by polishing under a condition that the value of A+B and the value of A/B are in the ranges described above.

The polishing is preferably performed under a condition that the A and B satisfy the relation of $1.5 \leq A/B \leq 2.5$. When $1.5 \leq A/B$, it becomes more certain to realize F-ZDD<0. When $A/B \leq 2.5$, the lower polishing pad 5 is secured to have a more sufficient thickness, thereby being securely prevented from tearing caused during double-side polishing. Preferably, the thickness B of the lower polishing pad 5 attached to the lower turn table is 0.3 mm or more, that is, $B \geq 0.3$. The lower polishing pad 5 having a thickness B of 0.3 mm or more is preferable since the polishing pad is prevented from causing a problem of the strength.

As the upper and lower polishing pads 4 and 5 that are attached to the upper and lower turn tables 2 and 3 respectively, it is preferably to use one having a Shore A hardness of 85 or more and 95 or less. When the Shore A hardness of each of the polishing pads 4 and 5 is 85 or more, the GBIR and F-ZDD can be controlled more accurately. When the Shore A hardness of each of the polishing pads 4 and 5 is 95 or less, the semiconductor wafer W is hard to cause a scratch.

EXAMPLE

Hereinafter, the present invention will be more specifically described by showing Examples and Comparative Examples, but the present invention is not limited these Examples.

Example 1

By using the double-side polishing apparatus 1 as shown in FIG. 1, five pieces of silicon wafers with the diameter of 300 mm were polished in accordance with the double-side polishing method of the present invention. Each silicon wafer after the double-side polishing was subjected to SC-1 cleaning and subsequent evaluation of the flatness.
[Conditions of Double-Side Polishing]

In this case, DSP-20B (made by Fujikoshi Machinery Corp.) was used as a double-side polishing apparatus, with the thickness A of the upper polishing pad being 1.40 mm and the thickness B of the lower polishing pad being 0.60 mm, that is, A+B=2.00 (mm) and A/B=2.33. The material of the polishing pad was foamed polyurethane pad with the Shore A hardness of 90.

The carrier was made of titanium substrate. The holding hole was provided with an insert at the internal circumference. The material used for the insert was FRP (fiber reinforced plastic) in which glass fibers had been impregnated with an epoxy resin. A KOH based polishing agent containing silica abrasive grains was used. The average particle diameter of the silica abrasive grains was 35 nm, the concentration of the abrasive grains was 1.0% by mass, and the pH of the polishing agent was 10.5.

The polishing load was set to 1.50 gf/cm$^2$. The polishing time was set to a time in which the silicon wafer came to have the same thickness as the thickness of the carrier. The rotation rate of each driving parts was set to as follows: the upper turn table: −13.4 rpm, the lower turn table: 35 rpm, the sun gear: 25 rpm, and the internal gear: 7 rpm.

Dressing of the upper and lower polishing pads was performed by bringing a dress plate on which diamond abrasive grains had been electro-deposited into sliding contact with the upper and lower polishing pads while flowing pure water.
[Cleaning Condition]

For the SC-1 cleaning of a silicon wafer subjected to double-side polishing, a cleaning agent in a mixing ratio of $NH_4OH:H_2O_2:H_2O=1:1:15$.
[Conditions of Flatness Evaluation]

The flatness was evaluated by measuring GBIR and F-ZDD by using Wafer Sight (made by KLA-Tencor Co., Ltd). In calculating the F-ZDD, a zone of M49 mode (alias: Polar Sites) was set to 30 mm Length (2 mm E.E.) of 72 Sector, and the averaged value of each angle at 148 mm was adopted.

Figure 2:
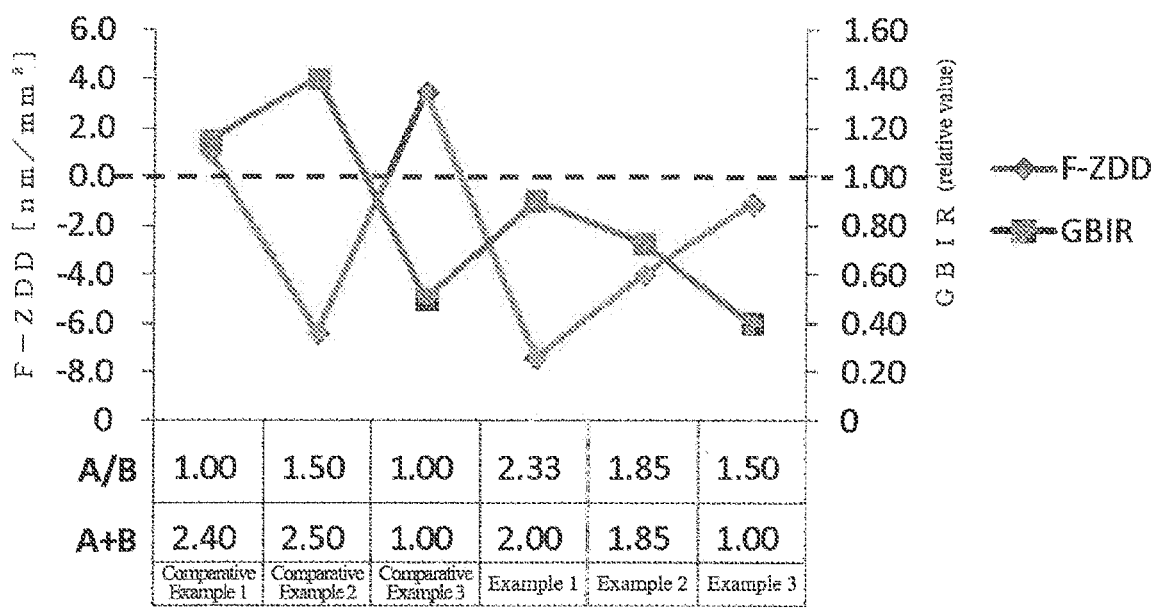
FIG. 2 is a graph to show the GBIR and the F-ZDD measured in Examples 1-3 and Comparative Examples 1-3.

Regarding the five pieces of silicon wafers that was subjected to double-side polishing in Example 1, the average value of GBIR and the average value of F-ZDD are shown in FIG. 2. In FIG. 2, the GBIR is represented by a relative value based on a value required by customer, that is, a relative value when the required value is set to 1.

As a result, as can be seen from FIG. 2 and Table 1, Example 1 realized the relative GBIR value of 0.90, which value met the required value and was smaller than the GBIR values in Comparative Examples 1 and 2 using previous arts described later. In Example 1, silicon wafers with good flatness could be obtained like this. In addition, the F-ZDD was found to be −7.4 (nm/mm$^2$), becoming less than 0.

TABLE 1

|  | A [mm] | B [mm] | A + B | A/B | F-ZDD [nm/mm$^2$] | GBIR |
|---|---|---|---|---|---|---|
| Comparative Example 1 | 1.20 | 1.20 | 2.40 | 1.00 | 1.0 | 1.15 |
| Comparative Example 2 | 1.50 | 1.00 | 2.50 | 1.50 | −6.4 | 1.40 |
| Comparative Example 3 | 0.50 | 0.50 | 1.00 | 1.00 | 3.5 | 0.50 |
| Example 1 | 1.40 | 0.60 | 2.00 | 2.33 | −7.4 | 0.90 |
| Example 2 | 1.20 | 0.65 | 1.85 | 1.85 | −4.0 | 0.73 |
| Example 3 | 0.60 | 0.40 | 1.00 | 1.50 | −1.1 | 0.40 |

Example 2

Double-side polishing was performed under the same conditions as in Example 1, except that the thickness of the upper polishing pad was 1.20 mm, and the thickness of the lower polishing pad was 0.65 mm. The flatness was evaluated by the same method as in Example 1. That is, double-side polishing was performed under the conditions of A+B=1.85 and A/B=1.85 in Example 2.

As a result, as can be seen from FIG. 2 and Table 1, Example 2 realized the relative GBIR value of 0.73, which value met the required value and was smaller than the GBIR values in Comparative Examples 1 and 2 using previous arts described later. In Example 2, silicon wafers with good flatness could be obtained like this. In addition, the F-ZDD was found to be −4.0 (nm/mm$^2$), becoming less than 0.

Example 3

Double-side polishing was performed under the same conditions as in Example 1, except that the thickness of the upper polishing pad was 0.60 mm, and the thickness of the lower polishing pad was 0.40 mm. The flatness was evaluated by the same method as in Example 1. That is, double-side polishing was performed under the conditions of A+B=1.00 and A/B=1.50 in Example 3.

As a result, as can be seen from FIG. 2 and Table 1, Example 3 realized the relative GBIR value of 0.40, which value met the required value and was smaller than the GBIR values in Comparative Examples 1-3 using previous arts described later. In Example 3, silicon wafers with good flatness could be obtained like this. In addition, the F-ZDD was found to be −1.1 (nm/mm$^2$), becoming less than 0.

Comparative Example 1

Double-side polishing was performed under the same conditions as in Example 1, except that both of the thicknesses of the upper polishing pad and the lower polishing pad were 1.20 mm. The flatness was evaluated by the same method as in Example 1. That is, double-side polishing was performed under the conditions of A+B=2.4>2.0 and A/B=1.0 in Comparative Example 1.

These results are shown in FIG. 2 and Table 1. As can be seen from FIG. 2 and Table 1, the F-ZDD resulted in 1.0 (nm/mm$^2$), becoming 0 or more. When A/B≤1.0, the F-ZDD became 0 or more like this. The GBIR became 1.15, overstepping the required value. It was confirmed that the GBIR came to increase and the flatness worsened when A+B>2.0 like this.

Comparative Example 2

Double-side polishing was performed under the same conditions as in Example 1, except that the thickness of the upper polishing pad was 1.50 mm, and the thickness of the lower polishing pad was 1.00 mm. The flatness was evaluated by the same method as in Example 1. That is, double-side polishing was performed under the conditions of A+B=2.50 and A/B=1.50 in Comparative Example 2.

As a result, as can be seen from FIG. 2 and Table 1, the GBIR resulted in 1.40, overstepping the required value. The GBIR overstepped the required value like this when A+B>2.0.

Comparative Example 3

Double-side polishing was performed under the same conditions as in Example 1, except that both of the thicknesses of the upper polishing pad and the lower polishing pad were 0.50 mm. The flatness was evaluated by the same method as in Example 1. That is, double-side polishing was performed under the conditions of A+B=1.00 and A/B=1.00 in Comparative Example 3.

As a result, as can be seen from FIG. 2 and Table 1, the F-ZDD resulted in 3.5 (nm/mm$^2$), becoming 0 or more. The F-ZDD became 0 or more like this when A/B≤1.0.

From the results of Examples 1-3 and Comparative Examples 1-3 described above, it was confirmed that silicon wafers satisfying the required value of GBIR and satisfying F-ZDD<0 were obtained by using the double-side polishing method or the double-side polishing apparatus of the present invention. It is to be noted that double-side polishing under the conditions of A+B<1.0 resulted in breakage of the lower polishing pad during the processing since the thickness of the lower polishing pad was too thin, thereby failing to complete the double-side polishing.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A double-side polishing method comprising:
    simultaneously polishing both surfaces of a semiconductor wafer by holding the semiconductor wafer in a carrier;
    interposing the held semiconductor wafer between an upper turn table and a lower turn table each having a polishing pad attached thereto; and
    bringing both surfaces of the semiconductor wafer into sliding contact with the polishing pads,
    wherein the semiconductor wafer is polished under a condition that an average thickness A (mm) of the polishing pad attached to the upper turn table and an average thickness B (mm) of the polishing pad attached to the lower turn table satisfy relations of 1.0≤A+B≤2.0 and A/B>1.0.

2. The double-side polishing method according to claim 1, wherein the semiconductor wafer is polished under a condition that the average thickness A (mm) of the polishing pad attached to the upper turn table and the average thickness B (mm) of the polishing pad attached to the lower turn table further satisfy a relation of 1.5≤A/B≤2.5.

3. The double-side polishing method according to claim 2, wherein the average thickness B of the polishing pad attached to the lower turn table is 0.3 mm or more.

4. The double-side polishing method according to claim 2, wherein the polishing pad attached to each of the upper turn table and the lower turn table has a Shore A hardness of 85 or more and 95 or less.

5. The double-side polishing method according to claim 4, wherein the average thickness B of the polishing pad attached to the lower turn table is 0.3 mm or more.

6. The double-side polishing method according to claim 1, wherein the polishing pad attached to each of the upper turn table and the lower turn table has a Shore A hardness of 85 or more and 95 or less.

7. The double-side polishing method according to claim 6, wherein the average thickness B of the polishing pad attached to the lower turn table is 0.3 mm or more.

8. The double-side polishing method according to claim 1, wherein the average thickness B of the polishing pad attached to the lower turn table is 0.3 mm or more.

9. The double-side polishing method according to claim 1, wherein the polishing pad attached to the upper turn table and the polishing pad attached to the lower turn table each have a uniform thickness.

10. A double-side polishing apparatus comprising:
   an upper turn table and a lower turn table each having a polishing pad attached thereto; and
   a carrier having a holding hole formed therein to hold a semiconductor wafer between the upper turn table and the lower turn table,
   wherein an average thickness A (mm) of the polishing pad attached to the upper turn table and an average thickness B (mm) of the polishing pad attached to the lower turn table satisfy relations of $1.0 \leq A+B \leq 2.0$ and $A/B>1.0$.

11. The double-side polishing apparatus according to claim 10, wherein the average thickness A (mm) of the polishing pad attached to the upper turn table and the average thickness B (mm) of the polishing pad attached to the lower turn table further satisfy a relation of $1.5 \leq A/B \leq 2.5$.

12. The double-side polishing apparatus according to claim 11, wherein the average thickness B of the polishing pad attached to the lower turn table is 0.3 mm or more.

13. The double-side polishing apparatus according to claim 11, wherein the polishing pad attached to each of the upper turn table and the lower turn table has a Shore A hardness of 85 or more and 95 or less.

14. The double-side polishing apparatus according to claim 13, wherein the average thickness B of the polishing pad attached to the lower turn table is 0.3 mm or more.

15. The double-side polishing apparatus according to claim 10, wherein the polishing pad attached to each of the upper turn table and the lower turn table has a Shore A hardness of 85 or more and 95 or less.

16. The double-side polishing apparatus according to claim 15, wherein the average thickness B of the polishing pad attached to the lower turn table is 0.3 mm or more.

17. The double-side polishing apparatus according to claim 10, wherein the average thickness B of the polishing pad attached to the lower turn table is 0.3 mm or more.

18. The double-side polishing method according to claim 10, wherein the polishing pad attached to the upper turn table and the polishing pad attached to the lower turn table each have a uniform thickness.

* * * * *